United States Patent
Samadi et al.

(10) Patent No.: US 10,510,651 B2
(45) Date of Patent: Dec. 17, 2019

(54) HARD MACRO HAVING BLOCKAGE SITES, INTEGRATED CIRCUIT INCLUDING SAME AND METHOD OF ROUTING THROUGH A HARD MACRO

(71) Applicant: QUALCOMM Incorporated, San Diego, CA (US)

(72) Inventors: Kambiz Samadi, San Diego, CA (US); Shreepad Amar Panth, Atlanta, GA (US); Yang Du, Carlsbad, CA (US); Robert Philip Gilmore, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/220,764

(22) Filed: Dec. 14, 2018

(65) Prior Publication Data
US 2019/0122973 A1    Apr. 25, 2019

Related U.S. Application Data

(62) Division of application No. 13/753,193, filed on Jan. 29, 2013, now Pat. No. 10,192,813.
(Continued)

(51) Int. Cl.
*H01L 23/498* (2006.01)
*H01L 21/768* (2006.01)
*G06F 17/50* (2006.01)

(52) U.S. Cl.
CPC .... *H01L 23/49827* (2013.01); *G06F 17/5068* (2013.01); *H01L 21/76802* (2013.01); *H01L 2924/0002* (2013.01)

(58) Field of Classification Search
CPC ................ H01L 21/768; H01L 23/498; H01L 2924/0002; G06F 17/50
See application file for complete search history.

(56) References Cited

U.S. PATENT DOCUMENTS

| | | | |
|---|---|---|---|
| 6,060,784 | A | 5/2000 | Oda |
| 6,226,775 | B1 | 5/2001 | Yamada |

(Continued)

FOREIGN PATENT DOCUMENTS

| | | |
|---|---|---|
| CN | 1313635 A | 9/2001 |
| CN | 102754102 A | 10/2012 |

(Continued)

OTHER PUBLICATIONS

Beanato, Giulia et al., "Design and Testing Strategies for Modular 3-D-Multiprocessor Systems Using Die-Level Through Silicon Via Technology," IEEE Journal on Emerging and Selected Topics in Circuits and Systems, vol. 2, No. 2, Jun. 1, 2012, IEEE, pp. 295-306.

(Continued)

*Primary Examiner* — David A Zarneke
(74) *Attorney, Agent, or Firm* — Withrow & Terranova, PLLC

(57) ABSTRACT

A hard macro includes a periphery defining a hard macro area and having a top and a bottom and a hard macro thickness from the top to the bottom, the hard macro including a plurality of vias extending through the hard macro thickness from the top to the bottom. Also an integrated circuit having a top layer, a bottom layer and at least one middle layer, the top layer including a top layer conductive trace, the middle layer including a hard macro and the bottom layer including a bottom layer conductive trace, wherein the top layer conductive trace is connected to the bottom layer conductive trace by a via extending through the hard macro.

6 Claims, 5 Drawing Sheets

Related U.S. Application Data

(60) Provisional application No. 61/726,031, filed on Nov. 14, 2012.

(56) References Cited

U.S. PATENT DOCUMENTS

| | | |
|---|---|---|
| 6,543,040 B1 | 4/2003 | Bednar et al. |
| 6,883,155 B2 | 4/2005 | Bednar et al. |
| 7,334,206 B2 | 2/2008 | Dinter et al. |
| 2009/0013296 A1 | 1/2009 | Katsuzawa |
| 2011/0140288 A1 | 6/2011 | Yang et al. |
| 2012/0304142 A1 | 11/2012 | Morimoto et al. |
| 2014/0131885 A1 | 5/2014 | Samadi et al. |

FOREIGN PATENT DOCUMENTS

| | | |
|---|---|---|
| JP | H0964190 A | 3/1997 |
| JP | 2001298094 A | 10/2001 |
| JP | 2006019328 A | 1/2006 |
| WO | 2012077280 A1 | 6/2012 |

OTHER PUBLICATIONS

International Search Report and Written Opinion for PCT/US2013/070014, dated Feb. 25, 2014.
International Preliminary Report on Patentability for PCT/US2013/070014, dated May 28, 2015, 9 pages.

HARD MACRO HAVING BLOCKAGE SITES, INTEGRATED CIRCUIT INCLUDING SAME AND METHOD OF ROUTING THROUGH A HARD MACRO

CROSS-REFERENCE TO RELATED APPLICATIONS

The present application is a divisional application of and claims priority to U.S. patent application Ser. No. 13/753,193, filed Jan. 29, 2013 and entitled "HARD MACRO HAVING BLOCKAGE SITES, INTEGRATED CIRCUIT INCLUDING SAME AND METHOD OF ROUTING THROUGH A HARD MACRO," now U.S. Pat. No. 10,192,813, which claims priority to U.S. Provisional Patent Application Ser. No. 61/726,031, filed Nov. 14, 2012 and entitled "HARD MACRO HAVING BLOCKAGE AREAS, INTEGRATED CIRCUIT INCLUDING SAME AND METHOD OF ROUTING THROUGH A HARD MACRO", both of which are incorporated herein by reference in their entireties.

FIELD OF THE DISCLOSURE

The present disclosure is directed to a hard macro having blockage sites and toward a method of routing through the hard macro, and, more specifically, toward a hard macro having a plurality of blockage sites at which vias can be formed and toward a method of routing an electrical connection through the hard macro by forming vias at the blockage sites.

BACKGROUND

"Macros" or "cores" are functional circuit elements or building blocks or units of logic that can be used by chip fabricators to create an application specific integrated circuit (ASIC) or a field programmable gate array (FPGA). Two common types of macros are referred to as "soft" and "hard" macros. Soft macros include logic for performing a particular function along with various interconnection rules for connecting sub-portions of the soft macro and/or for connecting portions of the soft macro to other elements outside the soft macro. They may comprise, for example, a gate-level netlist. Soft macros do not specify a physical wiring pattern and thus allow for flexibility in final physical implementation, however, due to the lack of a pre-specified physical wiring pattern, they may need to be optimized for desired performance and/or final layout in a floor-plan. Hard macros specify a fixed wiring pattern and are not modifiable. Hard macros are thus less flexible than soft macros but can be optimized for performance and physical layout prior to use.

Hard and soft macros are used in two dimensional integrated circuits. However, it is becoming more common to stack multiple integrated circuit layers and form three dimensional integrated circuits or "3D IC's" to achieve higher device packing density, lower interconnect RC delay, and lower cost. The size and configuration of macros must be taken into account during the floor-planning of a chip, especially a 3D IC. Soft macros may be modified to a degree and thus it may sometimes be possible to allow connections from elements in a layer above the soft macro to elements in a layer below the soft macro to run through the soft macro. Hard macros, however, have a fixed form factor, and it is generally necessary to route inter-layer connections around them. This increases the length of various interconnections and may require the use of additional buffers to compensate. Regions near the edges of hard macros can also become congested with conduction pathways from elements above or below the hard macro that need to pass by the hard macro to reach another layer of the chip.

FIG. 1 shows a multi-layer chip 100 having a first layer 102 having a first circuit element 104, a second layer 106 having a hard macro 108, and a third layer 110 having a second circuit element 112. The first circuit element 104 and/or second circuit element 112 could alternately represent pins or connection pads for the multi-layer chip 100 rather than actual circuit elements. The design of the chip 100 requires that the first circuit element 104 be connected to the second circuit element 112 located on the layer beneath the hard macro and two layers below the first circuit element 104. In order to make this connection, a via 114 is provided at a distance from the hard macro 108, and the first circuit element 104 is connected to the via 114 by a first trace 116 and the second circuit element is connected to the via 114 by a second trace 118. If the hard macro 108 were not present, a via could be provided directly beneath or closer to the first circuit element 104 or the second circuit element 112 to shorten the connection path therebetween. The presence of the hard macro 108 in the second layer 106 between the first and second circuit elements 104, 112 increases the length of the connection between the first and second circuit elements 104, 112.

In some cases it may be possible to break a single large hard macro into two or more smaller hard macros and provide the necessary interconnection rules for allowing the hard macros to communicate and to operate as if they were a single hard macro. This arrangement, however, requires on-chip optimization and may lead to a decrease in chip performance. It would therefore be desirable to provide a hard macro that retains the benefits of hard macros discussed above and which allows for greater flexibility in routing.

SUMMARY

The following summary is not an extensive overview of all contemplated aspects. Its sole purpose is to present some concepts of one or more aspects in a simplified form as a prelude to the more detailed description that is presented later.

An aspect of the disclosure comprises a hard macro having a periphery defining a hard macro area and having a top and a bottom and a hard macro thickness from the top to the bottom, the hard macro including a plurality of vias extending through the hard macro thickness from the top to the bottom.

Another aspect of the disclosure comprises a non-volatile computer readable medium storing instructions that, when executed by a computer, cause a computer-controlled device to create a hard macro having a periphery defining a hard macro area and having a top and a bottom and a hard macro thickness from the top to the bottom, and a plurality of vias extending through the hard macro from the top to the bottom.

A further aspect of the disclosure comprises a hard macro having a periphery defining a hard macro area and having a top and a bottom and a hard macro thickness from the top to the bottom. The hard macro includes a regular pattern of blockage sites on the hard macro top, the blockage sites extending through the hard macro from the top to the bottom.

Still another aspect of the disclosure comprises a non-volatile computer readable medium storing instructions that, when executed by a computer, cause a computer-controlled device to create a hard macro having a periphery defining a hard macro area and having a top and a bottom and a hard macro thickness from the top to the bottom, and a regular pattern of blockage sites on the hard macro top, the blockage sites extending through the hard macro from the top to the bottom.

Still a further aspect of the disclosure comprises an integrated circuit including a top layer, a bottom layer and at least one middle layer, the top layer including a top layer conductive trace, the middle layer including a hard macro and the bottom layer including a bottom layer conductive trace. The top layer conductive trace is connected to the bottom layer conductive trace by a via extending through the hard macro.

Another aspect of the disclosure comprises a non-volatile computer readable medium storing instructions that, when executed by a computer, cause a computer-controlled device to create an integrated circuit having a top layer, a bottom layer and at least one middle layer, the top layer including a top layer conductive trace, the middle layer including a hard macro and the bottom layer including a bottom layer conductive trace. The top layer conductive trace is connected to the bottom layer conductive trace by a via extending through the hard macro.

A further aspect of the disclosure comprises a method that includes forming a first layer of an integrated circuit, forming a second layer of the integrated circuit on the first layer of the integrated circuit, the second layer including at least one hard macro, forming at least one via through the hard macro, forming a third layer on top of the second layer, and electrically connecting an element on the first layer to an element on the third layer using the at least one via.

Still another aspect of the disclosure comprises an integrated circuit comprising a top layer, a bottom layer and at least one middle layer, the top layer including a top layer conductive trace, the middle layer including hard macro means form performing an operation and the bottom layer including a bottom layer conductive trace. The top layer conductive trace is connected to the bottom layer conductive trace by the hard macro means.

Still a further aspect of the disclosure comprises a method that includes steps for forming a first layer of an integrated circuit, steps for forming a second layer of the integrated circuit on the first layer of the integrated circuit, the second layer including at least one hard macro, steps for forming a via through the hard macro, steps for forming a third layer on top of the second layer and steps for electrically connecting an element on the first layer to an element on the third layer using the via.

BRIEF DESCRIPTION OF THE DRAWINGS

The accompanying drawings found in the attachments are presented to aid in the description of embodiments of the invention and are provided solely for illustration of the embodiments and not limitation thereof.

DETAILED DESCRIPTION

Figure 1:
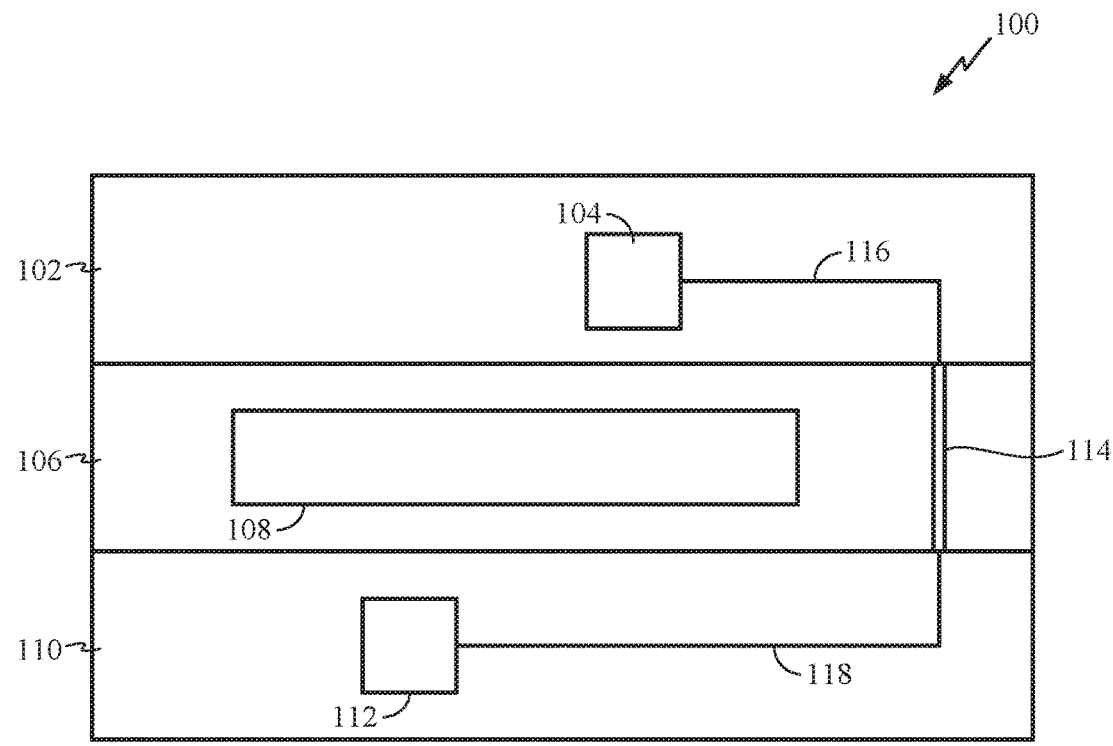
FIG. 1 is a schematic sectional side elevational view of a conventional multi-level chip having a hard macro in a central layer and showing the routing required to connect elements above and below the hard macro.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is only for the purpose of describing particular examples according to embodiments, and is not intended to be limiting of embodiments of the invention. As used herein, the singular forms "a", "an" and "the" are intended to include the plural forms as well, unless the context clearly indicates otherwise. As used herein the terms "comprises", "comprising,", "includes" and/or "including" specify the presence of stated structural and functional features, steps, operations, elements, and/or components, but do not preclude the presence or addition of one or more other structural and functional feature, steps, operations, elements, components, and/or groups thereof.

Spatially relative terms, such as "under", "below", "lower", "over", "upper", "lateral", "top", "bottom", "left", "right" and the like, may be used herein for ease of description to describe one element or feature's relationship to another element or feature as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields, electron spins particles, electrospins, or any combination thereof.

The term "topology" as used herein refers to interconnections of circuit components and, unless stated otherwise, indicates nothing of physical layout of the components or their physical locations relative to one another. Figures described or otherwise identified as showing a topology are no more than a graphical representation of the topology and do not necessarily describe anything regarding physical layout or relative locations of components.

Figure 2:
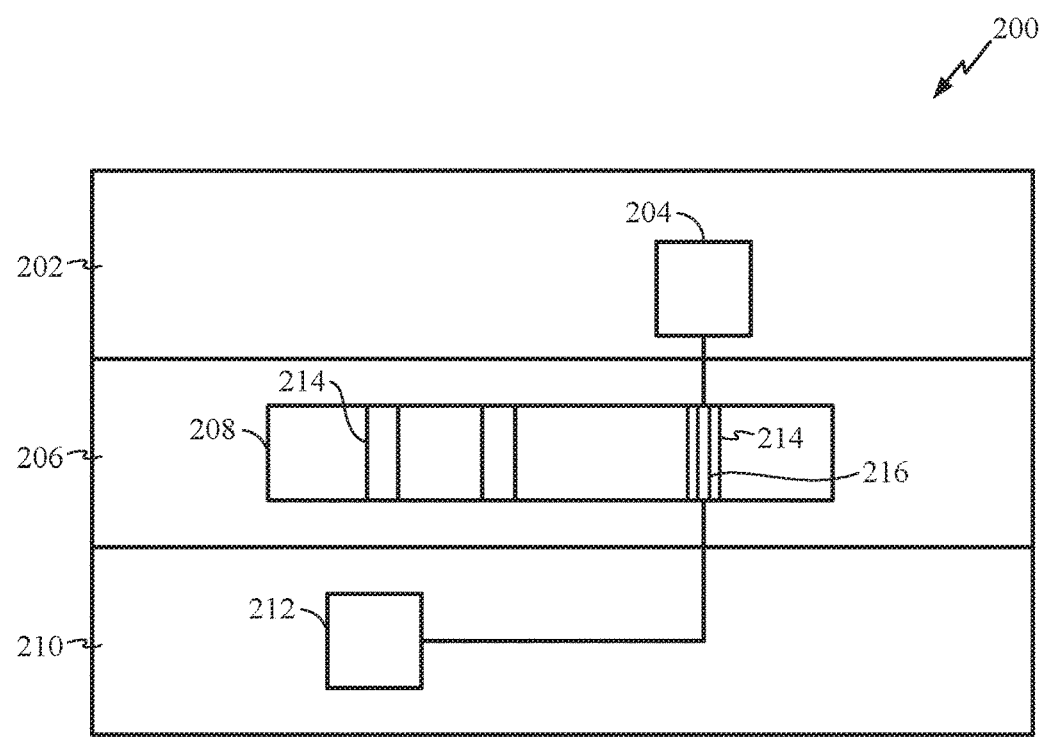
FIG. 2 is a schematic sectional side elevational view of a multi-level chip according to the present disclosure having a hard macro with at least one via formed therethrough and showing a first connection path through the hard macro.

FIG. 2 illustrates a multi-layer chip 200 having a first layer 202 having a first circuit element 204, a second layer 206 having a hard macro 208, and a third layer 210 having a second circuit element 212. The first circuit element 204 and/or second circuit element 212 could alternately represent pins or connection pads for the multi-layer chip 200 rather than actual circuit elements. The design of the multi-layer chip 200 requires that the first circuit element 204 be connected to the second circuit element 212 located on the layer beneath the hard macro 208 and two layers below the first circuit element 204. The hard macro 208 is provided with at least one and preferably a plurality of blockage sites 214 that are formed without logic elements or connections and at which blockage sites 214 vias 216 can be formed without adversely affecting the operation of the hard macro 208. In FIG. 2, three blockage sites 214 are illustrated; however a greater or lesser number of blockage sites 214 can be provided on the chip 200. Instead of routing a connection from the first circuit element 204 to the second circuit element 212 around the edge of the hard macro 208, a via 216 is formed at one of the blockage sites 214 to provide a shorter connection path from the first circuit element 204 to the second circuit element 212. The blockage sites 214 extend linearly through the hard macro 208.

Figure 3:
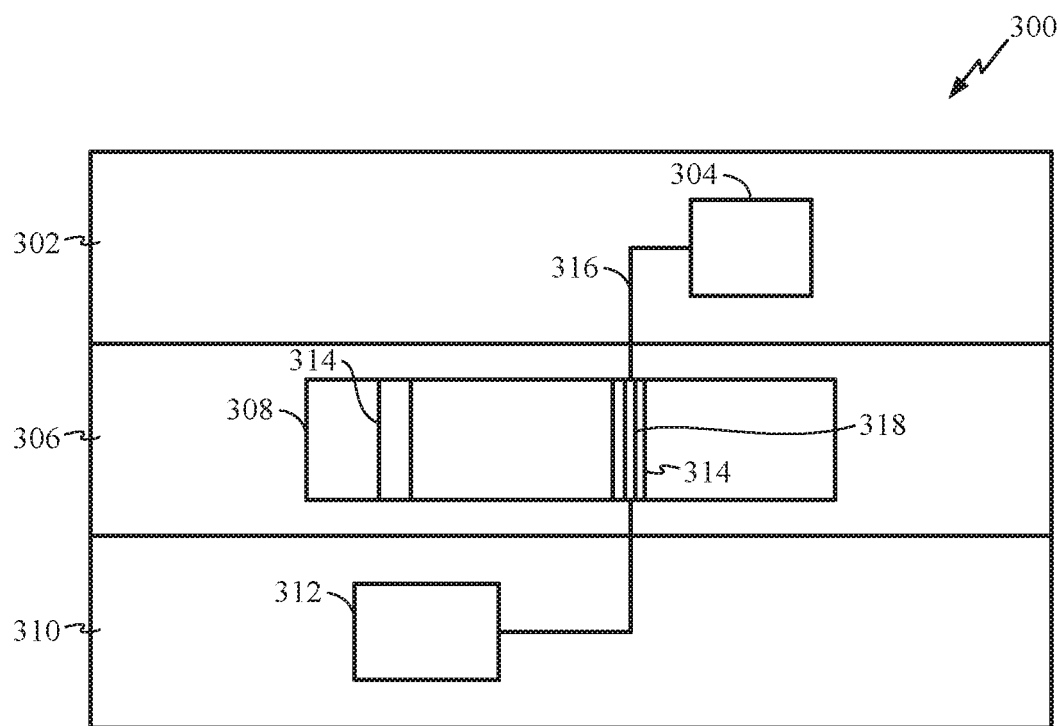
FIG. 3 is a schematic sectional side elevational view of a multi-level chip according to the present disclosure having a hard macro and showing a first connection path through one blockage site in the hard macro.
Figure 4:
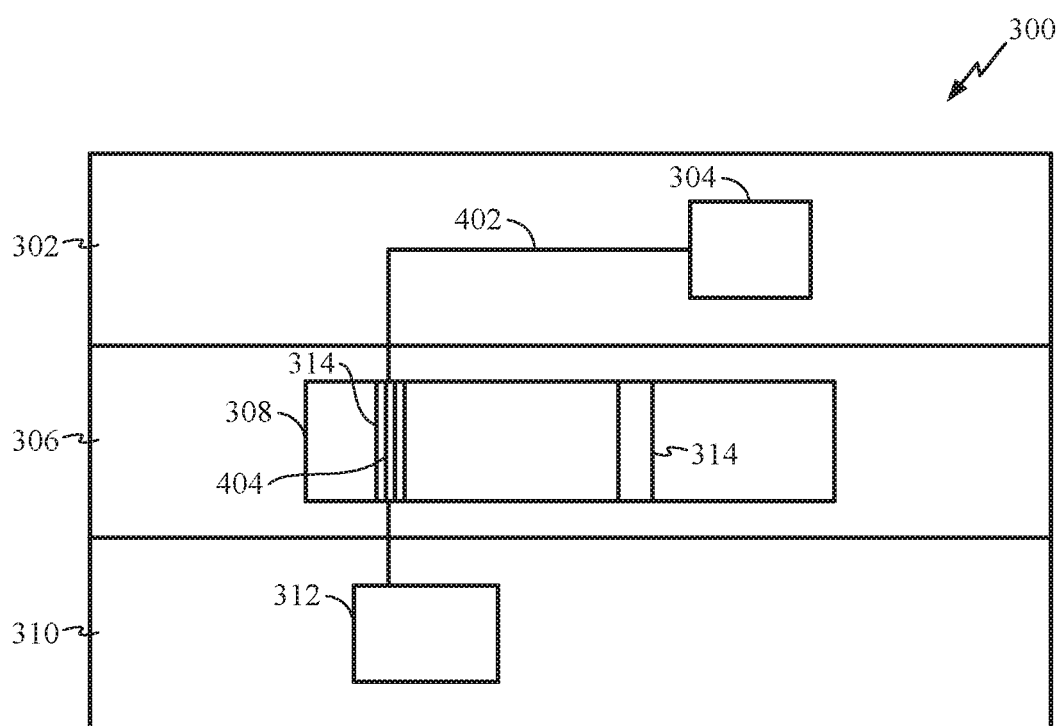
FIG. 4 is a schematic sectional side elevational view of the multi-level chip of FIG. 3 showing an alternate connection path through another blockage site in the hard macro.

FIGS. 3 and 4 illustrate a multi-layer chip 300 having a first layer 302 having a first circuit element 304, a second layer 306 having a hard macro 308, and a third layer 310 having a second circuit element 312. The first circuit element 304 and/or the second circuit element 312 could alternately represent pins or connection pads for the multi-layer chip 300 rather than actual circuit elements. The design of the multi-layer chip 300 requires that the first circuit element 304 be connected to the second circuit element 312 located on the layer beneath the hard macro 308 and two layers below the first circuit element 304. The hard macro 308 is provided with at least one and preferably a plurality of blockage sites 314 that are formed without logic elements or connections and at which blockage sites 314 vias 318 can be formed without adversely affecting the operation of the hard macro 308. Only two blockage sites 314 are illustrated in FIGS. 3 and 4, but a greater number would generally be provided. Unlike the multi-layer chip 200 of FIG. 2, the blockage sites 314 of chip 300 are horizontally offset from at least one of the first circuit element 304 and the second circuit element 312. However, even with such offsets, the connection from the first circuit element 304 to the second circuit element 312 is shorter than connections of the prior art which would have needed to route completely around the hard macro 308.

FIG. 3 shows a first connection route 316 which connects the first circuit element 304 to the second circuit element 312 by way of a via 318 in one of the blockage sites 314 close to the first circuit element 304. FIG. 4 shows a second connection route 402 which connects the first circuit element 304 to the second circuit element 312 by way of a via 404 formed in the blockage site 314 closer to the second circuit element 312. Which of these two routes is selected for via placement may depend on the other connections to and among the first and second circuit elements 304, 312 and/or the other circuit elements (not shown) and/or other electrical pathways (not shown) on the first, second and third layers 302, 306 and 310.

Figure 5:
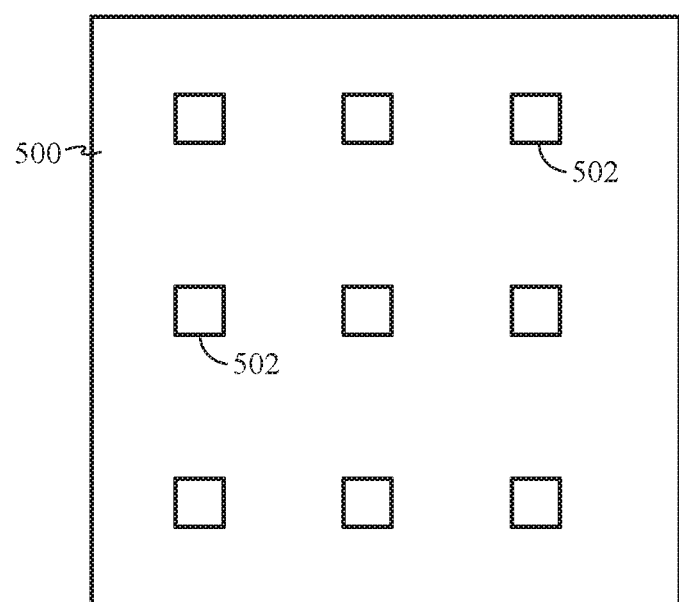
FIG. 5 is schematic plan view of a hard macro showing a first arrangement of blockage sites at which vias may be formed.

It may be possible to design a hard macro with blockage sites located in predetermined locations based on the desired final design of the 3D integrated circuit and the various elements that it will contain. However, it may be more practical to provide a relatively large number of blockage sites on the hard macro to provide flexibility to circuit designers who can place vias at as few or as many of the blockage sites as needed when laying out circuit interconnections. With reference to FIG. 5, hard macro 500 includes a plurality of blockage sites 502 arranged in a regular pattern having a constant spacing therebetween in the X and Y directions, a mesh or array of rows and columns in this case. The regular pattern could alternately have a regular spacing in one direction only or be arranged in a zigzag or non-rectangular pattern. The locations of the blockage sites may also be arranged in an irregular pattern. It should be noted that the blockage sites take up very little room and need only be large enough to accommodate several vias. The vias are so small that a few can be formed even in very small blockage areas. The size of the blockage sites relative to the hard macros and to the circuit elements are greatly exaggerated in the drawings.

It is unlikely that a circuit designer will ultimately form a via at every one of these blockage sites. It is also unlikely that elements which require interconnection will be located directly above and below a blockage site and so that they can be connected by a single vertical electrical connection. However, the large number of blockage sites spread across the surface of the hard macro provides improved routing flexibility and reduces the need to route around the edge of a hard macro, instead, providing various pathways through the hard macro which can be used as necessary.

Locations for the blockage sites are determined in part based on the block-to-block pin statistics from the block-level design netlist. Based on relevant design rules (including inter-tier via/landing pad pitch, etc.) and the block-to-block pin statistics the area available for blockage sites is calculated. Given the allowable area overhead budget (which is minimal due to extremely small sizes of monolithic 3D inter-tier vias) the number of blockage sites across the block can be determined. After blockage insertion, the modified block is taken through the physical implementation, e.g., placement and routing ("P&R").

Figure 6:
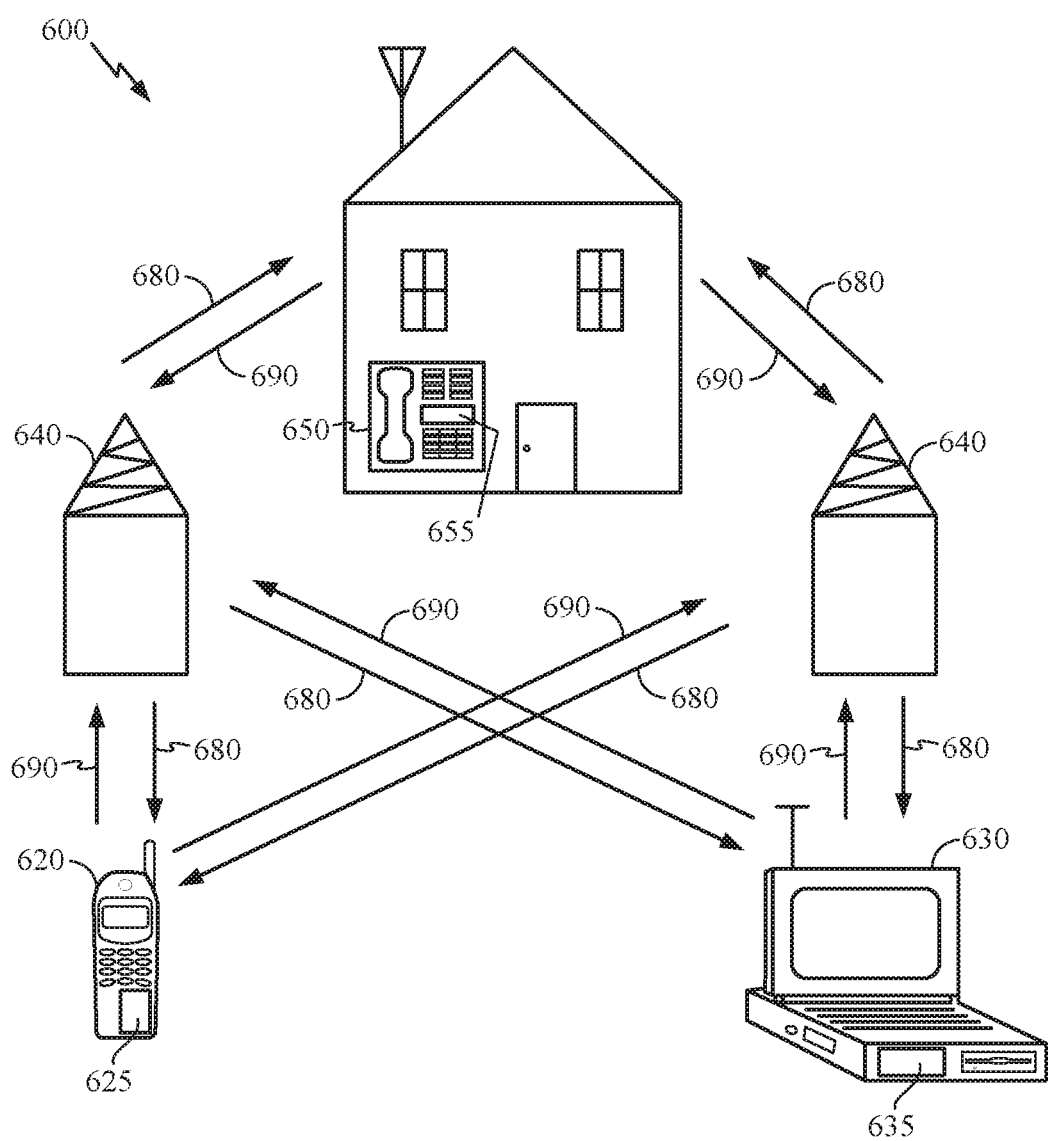
FIG. 6 is a schematic diagram of an exemplary wireless communication system in which embodiments of the disclosure may be used.
Figure 7:
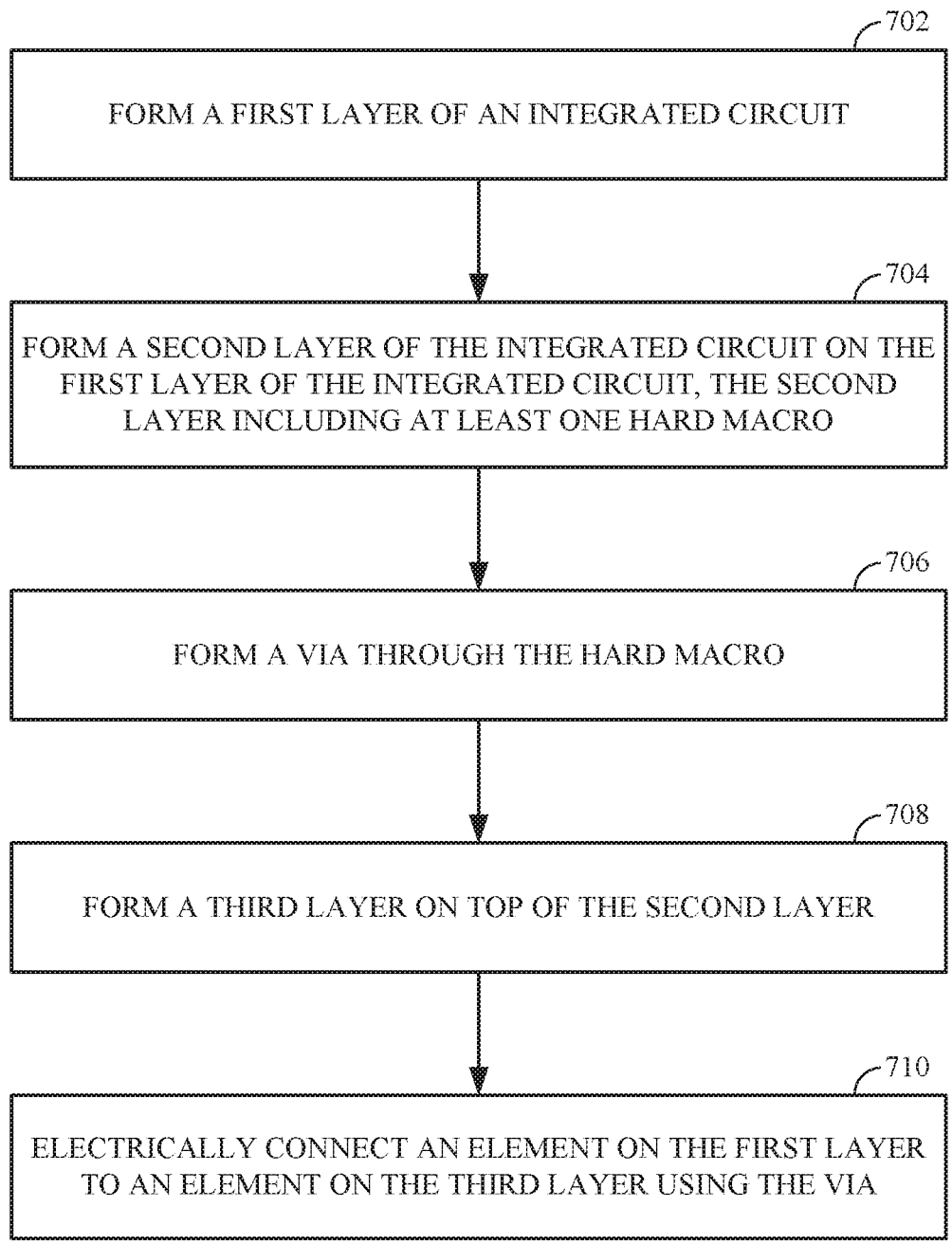
FIG. 7 is a flow chart illustrating a method according to the present disclosure.

FIG. 6 illustrates an exemplary wireless communication system 600 in which one or more embodiments of the disclosure may be advantageously employed. For purposes of illustration, FIG. 6 shows three remote units 620, 630, and 650 and two base stations 640. It will be recognized that conventional wireless communication systems may have many more remote units and base stations. The remote units 620, 630, and 650 include integrated circuits or other semiconductor devices 625, 635 and 655 (including hard macros as disclosed herein), which are among embodiments of the disclosure as discussed further below. FIG. 6 shows forward link signals 680 from the base stations 640 and the remote units 620, 630, and 650 and reverse link signals 690 from the remote units 620, 630, and 650 to the base stations 640.

In FIG. 6, the remote unit 620 is shown as a mobile telephone, the remote unit 630 is shown as a portable computer, and the remote unit 650 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

A method according to an embodiment comprises a block 702 of forming a first layer of an integrated circuit, a block 704 of forming a second layer of the integrated circuit on the first layer of the integrated circuit, the second layer including at least one hard macro, a block 706 of forming a via through the hard macro, a block 708 of forming a third layer on top of the second layer and a block 710 of electrically connecting an element on the first layer to an element on the third layer using the via.

The foregoing disclosed devices and functionalities (such as the devices of FIGS. 2-5 or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips can be employed in electronic devices, such as described hereinabove.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable medium embodying a method for implementation. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method comprising:
   forming a first layer of an integrated circuit;
   forming a second layer of the integrated circuit on the first layer of the integrated circuit, the second layer including at least one hard macro;
   forming at least one via through the hard macro;
   forming a third layer on top of the second layer; and
   electrically connecting an element on the first layer to an element on the third layer using the at least one via.

2. The method of claim 1, wherein the hard macro includes a plurality of blockage sites and wherein forming the via comprises forming the via at one of the plurality of blockage sites.

3. The method of claim 1, including forming a plurality of vias through the hard macro.

4. A method comprising:
   steps for forming a first layer of an integrated circuit;
   steps for forming a second layer of the integrated circuit on the first layer of the integrated circuit, the second layer including at least one hard macro;
   steps for forming a via through the hard macro;
   steps for forming a third layer on top of the second layer; and
   steps for electrically connecting an element on the first layer to an element on the third layer using the via.

5. The method of claim 4, wherein the macro includes a plurality of blockage sites and wherein the steps for forming the via comprise steps for forming the via at one of the plurality of blockage sites.

6. The method of claim 4, including steps for forming a plurality of vias through the hard macro.

* * * * *